United States Patent [19]
Radford et al.

[11] Patent Number: 5,721,429
[45] Date of Patent: Feb. 24, 1998

[54] SELF-FOCUSING DETECTOR PIXEL STRUCTURE HAVING IMPROVED SENSITIVITY

[75] Inventors: William A. Radford, Santa Barbara; Jerry A. Wilson, Goleta, both of Calif.

[73] Assignee: Hughes Electronics, Los Angeles, Calif.

[21] Appl. No.: 685,363

[22] Filed: Jul. 23, 1996

[51] Int. Cl.$^6$ .................. H01L 31/0232; H01L 31/0352
[52] U.S. Cl. ........................................... 250/338.4; 437/3
[58] Field of Search ................. 437/3; 250/338.4

[56] References Cited

U.S. PATENT DOCUMENTS

| | | | |
|---|---|---|---|
| 5,113,076 | 5/1992 | Schulte | 250/370.06 |
| 5,149,956 | 9/1992 | Norton | 250/211 J |
| 5,239,179 | 8/1993 | Baker | 250/338.4 |
| 5,380,669 | 1/1995 | Norton | 437/5 |
| 5,581,084 | 12/1996 | Chapman et al. | 250/338.4 |

OTHER PUBLICATIONS

"Some Properties of Photovoltaic $Cd_xHg_{1-x}Te$ Detectors for Infrared Radiation" by J. M. Pawlikowski et al., Infrared Physics, vol. 15 (1975) pp. 331–337, month not identified.

*Primary Examiner*—Constantine Hannaher
*Attorney, Agent, or Firm*—W. C. Schubert; W. K. Denson-Low

[57] ABSTRACT

An array of photodetectors is constructed of IR radiation-responsive Group II-VI alloy semiconductor material, such as HgCdTe. A novel photodetector structure utilizes internal reflections from mesa (10, 10') sidewalls and/or from reflective material (22) that is applied to the mesa sidewalls to achieve a concentration of incident infrared radiation into a significantly smaller radiation absorbing region (16). The resulting self-focusing or light piping effect enables the leakage current and other noise-generating processes to be minimized, while providing an effective large optical collection area. The fabrication of specular, flat, sloped mesa sidewalls is preferably accomplished by a reactive ion etch process. Signal crosstalk between photodetectors is reduced or eliminated since the radiation absorbing regions are fully delineated and isolated from one another by deep trenches that define the mesa sidewalls. Thus, the diffusion of optically generated carriers from one photodetector to an adjacent photodetector is prevented.

20 Claims, 2 Drawing Sheets

SELF-FOCUSING DETECTOR PIXEL STRUCTURE HAVING IMPROVED SENSITIVITY

FIELD OF THE INVENTION

This invention relates generally to detectors of electromagnetic radiation and, in particular, to mesa-type arrays of Group II-VI alloy semiconductor photodetectors that are responsive to infrared (IR) radiation.

BACKGROUND OF THE INVENTION

In mesa-type arrays of Group II-VI alloy semiconductor photodetectors a multilayered structure is first patterned and then etched to form a plurality of optically differentiated radiation photodetector sites or pixels. For a photovoltaic type of detector each optically differentiated pixel is comprised of portions of at least two layers of Group II-VI material that are contained within at least one mesa structure. The mesa has sloping sidewalls and exemplary dimensions for a base portion of 60 micrometers square and a height of five micrometers. At least two layers have different types of electrical conductivities (e.g., one layer is p-type and the other is n-type). The resulting p-n or n-p, heterojunction is reverse biased during use for collecting and reading out charge carriers (electrons or holes) that result from the absorption of IR radiation within at least one of the layers. For a backside illuminated array, the IR radiation is made to be incident upon a surface of a transparent substrate that is opposite to a surface that supports the mesa structures. The IR radiation passes through the substrate and into the radiation absorbing layer within a given mesa.

As the volume of the radiation absorbing layer within each mesa is made larger the collection efficiency of the photodetector can be increased, as there is a greater probability that a photon will be collected and absorbed. However, an increase in the volume of the radiation absorbing layer also results in a tendency towards increased thermal noise generation and other undesirable effects. More particularly, both the signal (photocurrent) and the leakage or dark current are proportional to pixel area. However, the noise is equal to the square root of the dark current. Therefore, the signal/noise ratio increases as the square root of the area as the area increases.

It can thus be appreciated that it is desirable to satisfy two conflicting goals, i.e., to maximize the collection efficiency of each photodetector, while at the same time minimizing a volume of the radiation absorbing layer.

It is known to employ a microlens element with each photodetector pixel to focus the incident radiation into a smaller collection volume. However, the fabrication of such microlenses is difficult, and often may not present a practical approach to improving the detector performance.

The microlens fabrication is accomplished on the radiation-admitting surface of the substrate. However, the required back surface processing can damage the photodetector pixels on the opposite, front surface. It is also difficult to achieve exact alignment registration between the microlenses and the photodetector pixels. Any misregistration between a microlens and the corresponding photodetector pixel results in a decrease in effectiveness of the microlens.

Furthermore, fabrication of microlenses also typically requires that the detector substrate be thinned. However, the thinning process makes the wafer more difficult to handle, and makes the wafer more susceptible to breakage and yield loss.

Since microlenses direct radiation by optical focusing their application is constrained by optical limits including diffraction effects and aberration.

OBJECTS OF THE INVENTION

It is thus one object of this invention to provide a method for fabricating an array of photodetectors so as to maximize the collection efficiency of each photodetector, while at the same time minimizing a volume of the radiation absorbing region of each photodetector.

It is another object of this invention to provide an array of mesa-type photodetectors that are constructed to provide for an internal reflection of incident electromagnetic radiation into a collection volume of the photodetector, thereby increasing the collection efficiency of each photodetector, while at the same time enabling a reduction in the volume of the radiation absorbing region of each photodetector.

It is a further object of this invention to provide an array of mesa-type photodetectors having sidewalls that are disposed at angle suitable for providing for a total internal reflection of incident electromagnetic radiation and a consequent focusing of the radiation into a collection volume of the photodetector. The collection volume can present a smaller cross section area than possible with a focusing micro lens.

It is one further object of this invention to provide an array of mesa-type photodetectors having sidewalls that are coated with a reflective material for reflecting incident electromagnetic radiation and a consequent focussing of the radiation into a collection volume of the photodetector, wherein the reflective material may also function as a common electrical contact to each of the photodetectors.

SUMMARY OF THE INVENTION

The foregoing and other problems are overcome and the objects of the invention are realized by photodetector structure that utilizes internal reflections from mesa sidewalls and/or from reflective material that is applied to the mesa sidewalls to achieve a concentration of incident infrared radiation into a significantly smaller radiation absorbing region. The resulting concentration of incident radiation (which may be considered as a light-piping effect) enables the leakage current and other noise-generating processes to be minimized, while providing an effective large optical collection area.

The fabrication of specular, flat, sloped mesa sidewalls is preferably accomplished by an anisotropic process such as a reactive ion etch process, as opposed to the conventional wet chemical etch that typically results in curved sidewalls, due to isotropic action, that are not suitable for supporting internal reflection.

In a presently preferred embodiment of this invention an array of photodetectors is comprised of IR radiation-responsive Group II-VI alloy semiconductor material, such as HgCdTe. The self-focussing effect resulting from the novel mesa construction beneficially increases the sensitivity of the photodetectors and reduces cross-talk between the photodetectors. Increases in hardness to gamma radiation can also be achieved, as can a reduction in the occurrence of defective or marginal photodetectors. The concentration effect allows the volume of the IR absorbing region to be reduced without correspondingly reducing quantum efficiency or responsivity. The reduction in the IR absorbing volume also leads to reduced noise by minimizing the thermal generation volume for photodetectors operating under diffusion-limited conditions. The noise is also reduced by a reduction in photodetector capacitance for those applications where the capacitance limits array noise. Signal crosstalk between photodetectors is reduced or eliminated since the IR radiation absorbing regions are fully delineated and isolated from one another by deep trenches that define the mesa sidewalls. Thus, the diffusion of optically generated carriers from one photodetector to an adjacent photodetector is prevented.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

Figure 1:
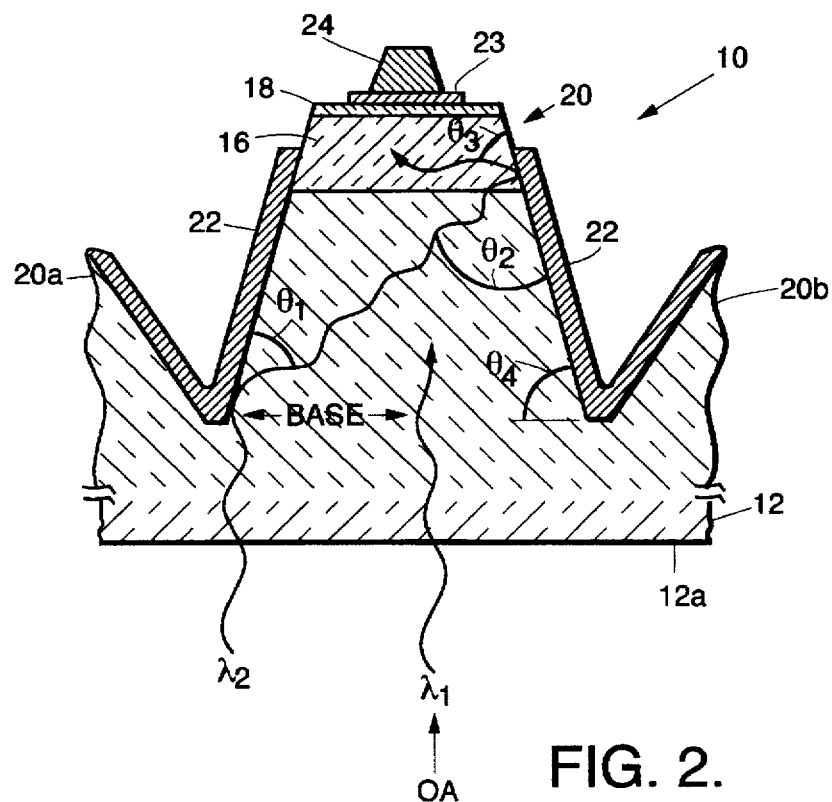
FIG. 1 is an enlarged cross-sectional view of a portion of an array of photodetectors that are constructed in accordance with a first embodiment of this invention.
Figure 3:
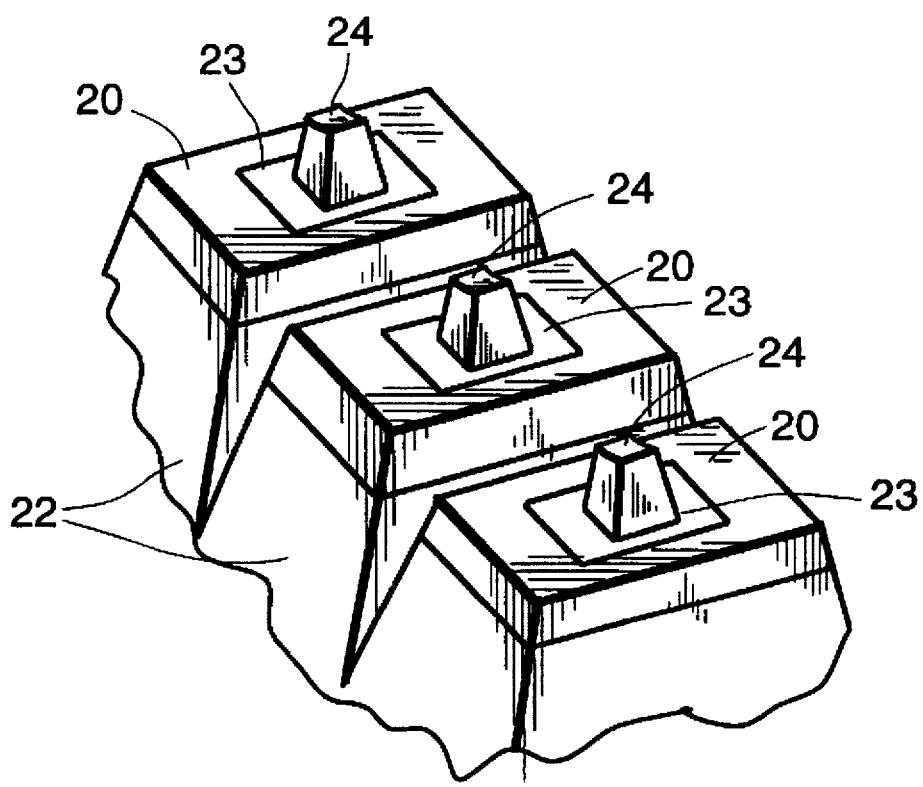
FIG. 3 is an elevational view of an array of photodiodes that are constructed in accordance with this invention.

Two embodiments of the invention are described herein. In a first embodiment of an array of radiation detectors 10, illustrated in FIG. 1, a transparent insulating substrate 12 has a doped radiation absorbing layer 16 that is epitaxially grown over a first surface thereof. An opposite surface 12a is a radiation admitting surface for photons indicated by $\lambda_1$ and $\lambda_2$. On top of the layer 16 is grown an oppositely doped capping layer 18 which forms a p-n heterojunction with the layer 16. The substrate and two epitaxial layers 16 and 18 are then processed to form a plurality of orthogonally disposed trenches which extend completely through the layers 16 and 18 and into the substrate 12. The trenches define a plurality of mesa structures as is shown in FIG. 3. FIG. 1 shows a first mesa structure 20 and portions of two adjacent mesa structures 20a and 20b.

In accordance with this invention the trenches are formed so as to provide flat, specular mesa side walls that are capable of supporting internal reflections. If desired, a layer of metalization 22 is applied to the mesa side walls up to, but not covering (shorting out), the heterojunction between the layers 16 and 18. The metalization 22 functions to reflect incident radiation within the mesa structure 20 such that photons, such as the photon $\lambda_2$, are directed or concentrated into the radiation absorbing layer 16, thereby improving the collection efficiency of the photodetector. Gold-nickel is one suitable metal system for forming the layer 22, which can be applied to the mesa structures by evaporation or sputtering after they have been suitably masked to cover the top of each mesa 20.

The use of the reflector metalization layer 22 provides the additional benefit that light entering the device at angles of incidence below the criteria for total internal reflection (Bragg limit) will also be reflected and ultimately absorbed in the detector. As a result, the use of the reflector metalization 22 improves the modulation transfer response of the detector over a wider range of sidewall slopes.

Additional processing forms an electrically conductive contact pad 23 and an electrical contact, such as an indium bump 24, to each mesa structure 20.

Figure 2:
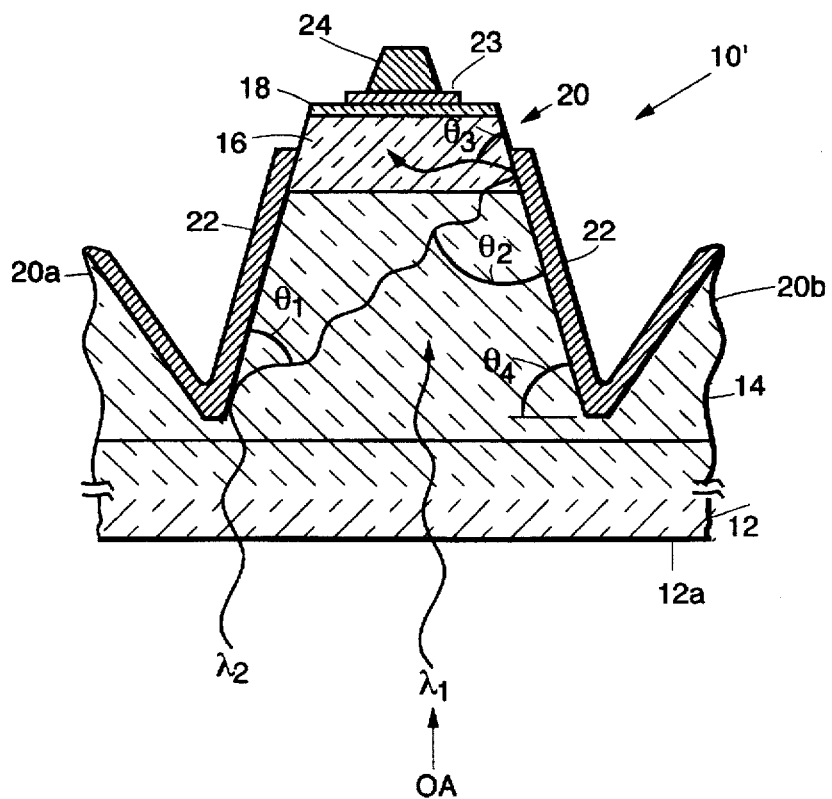
FIG. 2 is an enlarged cross-sectional view of a portion of an array of photodetectors that are constructed in accordance with a second embodiment of this invention.

The embodiment of an array of radiation detectors 10' of FIG. 2 differs from the embodiment of FIG. 1 in that a relatively thick, wider bandgap semiconductor layer 14 is first grown on the surface of the substrate 12 such that it is interposed between the radiation absorbing layer 16 and the substrate. In this embodiment the trenches are etched into the wider bandgap layer 14, and need not be etched into the substrate 12. As such, the thickness of the layer 14 is selected so as to at least accommodate the trenches that are etched into it.

The use of internal mesa reflection in the embodiments of FIGS. 1 and 2 provides, by example, a factor of 15 reduction in the volume of radiation absorbing material, as compared to conventional mesa-type photodetectors. This reduction in the volume in the radiation absorbing material translates to a significant reduction in the volume of the thermal noise generating material of the photodetector, and also in a significant reduction in the capacitance associated with the photodetector, such as p-n junction capacitance.

More particularly, and referring now to both FIGS. 1 and 2, the substrate 12 is preferably an electrically insulating semiconductor material that is substantially transparent at the wavelengths of light that are desired to be absorbed within the layer 16. CdTe, CdZnTe and CdTeSe are suitable substrate materials for constructing photodetectors that are responsive to IR-radiation. The layers 14, 16 and 18 are preferably comprised of $Hg_{(1-x)}Cd_xTe$, where x is selected in a well-known manner as a function of the band of IR wavelengths to be detected. General information regarding IR-responsive materials may be found in an article entitled "HgCdTe and Related Alloys", D. Long and J. L. Schmit, Semiconductors and Semimetals, Vol. 5, IR Detectors, Academic Press 1970. An article entitled "Some Properties of Photovoltaic $Cd_xHg_{1-x}Te$ Detectors for Infrared Radiation", by J. M. Pawlikowski and P. Becla, Infrared Physics, Vol. 15 (1975) pp. 331-337 describes photovoltaic p-n junction detectors constructed of HgCdTe crystals and epitaxial films. The authors report that the position of a photosensitivity maximum is shifted within a spectral region of 1-9 microns by changing a molar fraction of cadmium.

In general, the spectral regions that may be utilized by various embodiments of this invention include, but are not limited to, short wavelength IR (SWIR, approximately 0.8-3 micrometers), mid-wavelength IR (MWIR, approximately 3-8 micrometers), long wavelength IR (LWIR, approximately 8-12 micrometers), very long wavelength IR (VLWIR, approximately 12-20 micrometers), and the far IR (FIR, approximately 20-1000 micrometers).

The epitaxial layers 14, 16 and 18 are formed by conventional techniques such as Liquid Phase Epitaxy (LPE) or Vapor Phase Epitaxy (VPE), including Molecular Beam Epitaxy (MBE). The radiation absorbing layer 16 is preferably doped n-type with, by example, indium, while the collection layer 18 is doped p-type with, by example, arsenic. If used, the layer 14 is also doped n-type at a concentration of, by example, $10^{17}$ atoms/cm$^3$, so as to make the layer 14 electrically conductive for forming a common electrical contact to the n-type radiation absorbing layer 16 within each of the mesa structures 20. The p-type collection layer 18 has a thickness of approximately 2 micrometers, and the n-type absorbing layer 16 has a thickness of approximately 15 micrometers.

To form the self-focusing pixel, a deep isolation etch is performed using, preferably, a reactive ion etch (RIE) process. The RIE process has proven to be effective in producing mesa sidewalls with sufficient flatness and angles to achieve total internal reflection. The mesa sidewalls function as reflecting surfaces to funnel or reflect the incoming IR radiation to the small absorbing volume represented by the n-type layer 16. The incoming radiation is assumed to arrive along or close to an optical axis (OA) of an imaging system of which the photodetector arrays 10 and 10' form a part. The optical axis is typically normal to the radiation admitting surface 12a of the substrate 12. The angles of the sidewalls can vary over a considerable range, relative to the optical axis, and still achieve the desired effect. However, certain angles may prove to be an optimal choice for both each of fabrication and maximum concentration.

Representative angles in FIGS. 1 and 2 are as follows: $\theta_1=20°$, $\theta_2=60°$, $\theta_3=60°$, and $\theta_4=80°$.

The embodiments shown in FIGS. 1 and 2, using a 20° sidewall angle, enable a 60 µm×60 µm optical area (the dimensions of the base of the mesa structure 20) to be focused into a 15 µm×15 µm absorbing region (the approximate linear dimensions of the radiation absorbing layer 16). The height of the mesa structure 20 is approximately 62 µm. Contrasting this to a conventional mesa structure which has a height of approximately 5 µm and a radiation absorbing layer that is approximately 60 µm square, it can be realized that the height of the mesa structure 20 is greater than that of the conventional device. The additional height, and the resulting decrease in volume towards the apex of the mesa structure, provide for the beneficial reduction in the volume of the radiation absorbing layer 16. Furthermore, the flat, specular sidewalls that are achieved through the use of the RIE process, as opposed to a conventional isotropic wet chemical etch, enable internal reflections to be supported within the mesa structure 20, thereby collecting the incident IR photons that would otherwise be lost to absorption within non-sensitive portions of the mesa structure. In addition, the relatively deep trench depth, into either the insulating substrate 12 or the wider bandgap layer 14, provides enhanced electrical isolation between adjacent photodetectors, thereby minimizing or eliminating cross-talk between adjacent photodetectors.

It should further be noted that in the mesa structures 20 the thickness of the n-type absorbing layer 16 can be a small fraction of the total height of the mesa (e.g., 15 µm/62 µm≈25%). In contrast, in a typical conventional mesa structure the thickness of the radiation absorbing layer can comprise substantially all of the mesa thickness.

In the embodiment of FIG. 1, wherein the mesa 20 is etched into the electrically insulating (e.g., CdZnTe) substrate 12, the metal layer 22 is preferably deposited on the sidewalls of the mesa structures 20. The metal layer 22, such as a gold-nickel or chrome-nickel metal system, serves two purposes. First, it functions as a mirror to reflect the incident IR radiation away from the mesa sidewalls and back into the volume of the mesa. Second, it functions as an electrically conductive ground contact to the n-type absorbing layer 16 of each pixel.

If the sidewall angle, measured from the vertical, is greater than the critical angle (≈68°), total internal reflection (TIR) occurs at the mesa sidewall surface due to the refractive index difference between the substrate material (e.g., CdZnTe) and surrounding environment. As such, for slopes steeper than the critical angle the metal layer 22 is not required to achieve the internal reflection. However, at least a small strip of metal or some other electrical conductor is required for the ground contact to each mesa structure 20.

In the embodiment of FIG. 2, wherein the thick epitaxial layer 14 is grown prior to the growth of the n-type and p-type layers 16 an d 18, respectively, the layer 14 has a wider bandgap than the absorbing layer 16 in order to transmit the incident IR radiation. The layer 16 is also doped n-type in order to serve as the ground contact to each pixel. In this embodiment no metal deposition is required if the sidewall angles are less than the critical angle of the semiconductor material that forms the layer 14. By example, and assuming that the layer 14 is comprised of HgCdTe, then the critical angle to achieve total internal reflection will be in the range of approximately 15° to 20°, depending upon the specific HgCdTe alloy composition. Thus, and although FIG. 2 shows the use of the metal layer 22, for some embodiments of the invention the reflection can occur by total internal reflection, and the common electrical contact can be provided by the doped, electrically conductive layer 14.

However, and as was described previously, the use of the reflector metalization layer 22 may be desirable in all or most applications so as increase the modulation transfer response of the photodetector.

Although described thus far in the context of a photodetector that is responsive to but one band of wavelengths (e.g., MWIR), the teaching of this invention can also be used with detectors that are responsive to more than one band of wavelengths (i.e., two color detectors). The spectral bands may include SWIR, MWIR, LWIR, and VLWIR.

An array of such two-color IR detectors may be employed in a number of imaging applications wherein it is required to simultaneously detect radiation within two spectral bands from a scene within a field of view of the array. By example, the array may simultaneously detect LWIR and MWIR, or LWIR and SWIR.

Reference in this regard can be made to commonly assigned U.S. Pat. No. 5,113,076, issued May. 12, 1992, entitled "Two Terminal Multi-band Infrared Radiation Detector" to E. F. Schulte. This commonly assigned patent discloses a radiation detector having two heterojunctions that function in a manner analogous to two back-to-back photodiodes. Each of the photodiodes is responsive to radiation within a different IR spectral band, such as LWIR and MWIR. Detection of a particular wavelength band is achieved by switching a bias supply. Disclosed configurations include an n-p-n configuration, a p-n-p configuration, and a p-n-p-n configuration. Reference in this regard is also made to commonly assigned U.S. Pat. No. 5,149,956, issued Sep. 22, 1992, entitled "Two-Color Radiation Detector Array and Methods of Fabricating Same", by P. R. Norton; and to commonly assigned U.S. Pat. No. 5,380,669, issued Jan. 10, 1995, entitled "Method of Fabricating a Two-Color Radiation Detector Using LPE Crystal Growth", by P. R. Norton.

The radiation detector embodiments in accordance with this invention, wherein the volume of the radiation absorbing region is reduced without correspondingly reducing collection efficiency, are particularly well-adapted for use in applications where relatively high detector operating temperatures are desired. These include, but are not limited to, room-temperature SWIR detectors, and thermo-electrically cooled MWIR and VLWIR detectors. In general, the radiation detector embodiments in accordance with the teaching of this invention are especially well-suited for use in applications in which the detector performance is limited by diffusion leakage currents.

While the invention has been particularly shown and described with respect to preferred embodiments thereof, it will be understood by those skilled in the art that changes in form and details may be made therein without departing from the scope and spirit of the invention.

By example, the teaching of this invention is not limited for use only with Group II-VI based IR detectors, but can also be applied to Group IVA detectors, to Group III-V detectors, and to detectors comprised of combinations of the foregoing material types. The teaching of this invention can also be used to improve the operation of visible radiation detectors (approximately 0.4–0.8 micrometers). Furthermore, the sidewalls can be disposed at an angle, relative to an optical axis that is normal to said radiation admitting surface of said substrate, within a range of approximately 30° to approximately 10° for supporting total internal reflection of IR radiation arriving along the optical axis.

As such, the teaching of this invention is not intended to be limited to only the particular material types, angles, geometries, wavelengths and the like that are detailed above, but should be given a scope commensurate with the scope of the claims that follow.

What is claimed is:

1. A radiation detector comprising:
   a substrate having a first surface and a second, opposite surface, said second surface being a radiating admitting surface; and
   a plurality of layers of semiconductor material overlying said first surface, at least one of said plurality of layers being a radiation absorbing layer that is responsive to electromagnetic radiation within a predetermined range of wavelengths, said plurality of layers being contained within a mesa structure having a base, a top surface, and sloping sidewalls that extend from said top surface to said base, wherein said at least one radiation absorbing layer is disposed nearer to said top surface than to said base, and wherein said mesa structure comprises means for concentrating radiation entering through said base towards said at least one radiation absorbing layer.

2. A radiation detector as set forth in claim 1, wherein said concentrating means is comprised of said sloping sidewalls, and wherein said sidewalls are disposed at an angle to an optical axis for supporting total internal reflection of electromagnetic radiation arriving along the optical axis.

3. A radiation detector as set forth in claim 1, wherein said concentrating means is comprised of a layer of reflective material that is disposed upon said sloping sidewalls.

4. A radiation detector as set forth in claim 1, wherein said range of wavelengths are within a band of wavelengths that extends from visible light to the far infrared.

5. A radiation detector as set forth in claim 1, wherein said plurality of layers of semiconductor material include a first radiation absorbing layer that is responsive to electromagnetic radiation within a first predetermined range of wavelengths, and a second radiation absorbing layer that is responsive to electromagnetic radiation within a second predetermined range of wavelengths.

6. A radiation detector as set forth in claim 1, wherein said plurality of layers of semiconductor material are comprised of Group II-VI alloy semiconductor material, and wherein said predetermined range of wavelengths is within the infrared.

7. A radiation detector as set forth in claim 1, wherein said base is located within said substrate.

8. A radiation detector as set forth in claim 1, wherein one of said plurality of layers is a layer that is interposed between said first surface of said substrate and said at least one radiation absorbing layer, and wherein said base is located within said interposed layer.

9. A radiation detector as set forth in claim 8, wherein a bandgap of said interposed layer is wider than a bandgap of said at least one radiation absorbing layer.

10. An array of IR radiation responsive photodetectors, comprising:
    a substrate having a first surface and a second, opposite surface, said second surface being a radiating admitting surface; and
    a plurality of mesa structures overlying said first surface, individual ones of said plurality of mesa structures containing a plurality of layers comprised of Group II-VI semiconductor material, at least one of said plurality of layers being a radiation absorbing layer that is responsive to IR radiation within a predetermined range of wavelengths, said at least one layer having a first electrical conductivity type for forming a heterojunction with another of said plurality of layers that has an opposite electrical conductivity type, each of said plurality of mesa structures having a base, a top surface, and sloping sidewalls that extend from said top surface to said base, wherein said at least one radiation absorbing layer is disposed nearer to said top surface than to said base, and wherein individual ones of said plurality of mesa structures comprise means for reflecting IR radiation that enters through said base, and that impinges on one of said sidewalls, towards said at least one radiation absorbing layer.

11. An array of IR radiation responsive photodetectors as set forth in claim 10, wherein said reflecting means is comprised of said sloping sidewalls, and wherein said sidewalls are disposed at an angle to an optical axis for supporting total internal reflection of IR radiation arriving along the optical axis.

12. An array of IR radiation responsive photodetectors as set forth in claim 10, wherein said reflecting means is comprised of a layer of metalization that is disposed upon said sloping sidewalls.

13. An array of IR radiation responsive photodetectors as set forth in claim 10, wherein said plurality of layers include a first radiation absorbing layer that is responsive to IR radiation within a first predetermined range of wavelengths, and a second radiation absorbing layer that is responsive to IR radiation within a second predetermined range of wavelengths.

14. An array of IR radiation responsive photodetectors as set forth in claim 10, wherein said base is located within said substrate, and further comprising electrical contact means for forming a common electrical connection to each of said mesa structures.

15. An array of IR radiation responsive photodetectors as set forth in claim 10, wherein one of said plurality of layers is a layer that is interposed between said first surface of said substrate and said at least one radiation absorbing layer, wherein said base is located within said interposed layer, and wherein a bandgap of said interposed layer is wider than a bandgap of said at least one radiation absorbing layer.

16. An array of IR radiation responsive photodetectors as set forth in claim 10, wherein each of said mesa structures is comprised of a Group II-VI alloy semiconductor material that is interposed between said at least one radiation absorbing layer and said base, wherein said reflecting means is comprised of said sloping sidewalls, and wherein said sloping sidewalls are disposed at an angle, relative to an optical axis that is normal to said radiation admitting surface of said substrate, of approximately 30° to approximately 10° for supporting total internal reflection of IR radiation arriving along the optical axis.

17. An array of IR radiation responsive photodetectors as set forth in claim 10, wherein each of said mesa structures has a height measured from said base, wherein a thickness of said at least one radiation absorbing layer is less than half of said height, and wherein an area of said at least one radiation absorbing layer is significantly less than an area of said base.

18. A method for fabricating an array of electromagnetic radiation responsive photodiodes, comprising the steps of:

providing a substrate that is substantially transparent to wavelengths within a range of wavelengths of interest;

growing a plurality of layers upon a first surface of said substrate that is opposite to a second, radiation receiving surface of said substrate; and forming a plurality of orthogonally disposed trenches through said plurality of layers for differentiating said plurality of layers into a plurality of mesa structures each having a base, a top surface, and sloping sidewalls that extend from said top surface to said base, wherein the sloping sidewalls are disposed at an angle, relative to an optical axis that is normal to the radiation receiving surface of the substrate, for supporting total internal reflection of electromagnetic radiation towards the top surface.

19. A method as set forth in claim 18 wherein the step of forming a plurality of trenches includes a step of performing a reactive ion etch.

20. A method for fabricating an array of electromagnetic radiation responsive photodiodes, comprising the steps of:

providing a substrate that is substantially transparent to wavelengths within a range of wavelengths of interest;

growing a plurality of layers upon a first surface of said substrate that is opposite to a second, radiation receiving surface of said substrate;

forming a plurality of orthogonally disposed trenches through said plurality of layers for differentiating said plurality of layers into a plurality of mesa structures each having a base, a top surface, and sloping sidewalls that extend from said top surface to said base; and applying a reflective material to the sloping sidewalls for reflecting electromagnetic radiation that enters through the base, and that impinges on the sidewalls, towards the top surface.

* * * * *